(12) United States Patent
Deshmukh et al.

(10) Patent No.: US 9,081,900 B2
(45) Date of Patent: Jul. 14, 2015

(54) SYSTEMS AND METHODS FOR MINING TEMPORAL REQUIREMENTS FROM BLOCK DIAGRAM MODELS OF CONTROL SYSTEMS

(71) Applicants: Toyota Motor Engineering & Manufacturing North America, Inc., Erlanger, KY (US); The Regents of the University of California, Oakland, CA (US)

(72) Inventors: Jyotirmoy V. Deshmukh, Torrance, CA (US); Xiaoqing Jin, Riverside, CA (US); Alexandre Donze, Berkeley, CA (US); Sanjit A. Seshia, El Cerrito, CA (US)

(73) Assignees: Toyota Motor Engineering & Manufacturing North America, Inc., Erlanger, KY (US); The Regents of the University of California, Oakland, CA (US)

( * ) Notice: Subject to any disclaimer, the term of this patent is extended or adjusted under 35 U.S.C. 154(b) by 72 days.

(21) Appl. No.: 13/651,961

(22) Filed: Oct. 15, 2012

(65) Prior Publication Data

US 2014/0109036 A1    Apr. 17, 2014

(51) Int. Cl.
*G06F 9/44* (2006.01)
*G06F 9/45* (2006.01)
*G06F 11/36* (2006.01)
*G06F 11/34* (2006.01)

(52) U.S. Cl.
CPC ........ *G06F 11/3692* (2013.01); *G06F 11/3457* (2013.01); *G06F 11/3466* (2013.01); *G06F 11/3604* (2013.01)

(58) Field of Classification Search
CPC ............... G06F 8/10; G06F 8/20; G06F 8/24; G06F 8/34; G06F 11/3692; G06F 11/3457; G06F 11/3466; G06F 11/3604; G06Q 10/06
See application file for complete search history.

(56) References Cited

U.S. PATENT DOCUMENTS

| | | | | |
|---|---|---|---|---|
| 5,179,527 A | * | 1/1993 | Lawrenz | 703/6 |
| 5,754,738 A | * | 5/1998 | Saucedo et al. | 706/11 |
| 6,505,342 B1 | | 1/2003 | Hartmann et al. | |
| 6,804,814 B1 | * | 10/2004 | Ayers et al. | 717/135 |
| 7,421,668 B1 | * | 9/2008 | Ip et al. | 716/108 |
| 7,496,901 B2 | * | 2/2009 | Begg et al. | 717/128 |

(Continued)

OTHER PUBLICATIONS

Jones, K. Konrad, V., Analog Property Checker: A Ddr2 Case Study. Formula Methods in System Design, 2010, pp. 2-17.*

(Continued)

*Primary Examiner* — Thuy Dao
*Assistant Examiner* — Mongbao Nguyen

(57) ABSTRACT

Systems and methods for mining a temporal requirement from a block diagram model of a closed loop control system are disclosed. One embodiment of a method includes simulating the closed loop control system of a vehicle to obtain simulation traces and determining a candidate requirement by instantiating a template requirement with values of the simulation traces to locate parameter values that suggest that the template requirement is fulfilled. Some embodiments of the method include determining whether a counterexample to the candidate requirement exists; and in response to determining that the counterexample to the candidate requirement exists, obtaining the counterexample to the candidate requirement and adding the counterexample to the simulation traces for inspection.

16 Claims, 3 Drawing Sheets

FIG. 3

(56) References Cited

U.S. PATENT DOCUMENTS

| | | | |
|---|---|---|---|
| 7,533,069 B2 | 5/2009 | Fairweather | |
| 7,711,752 B2 | 5/2010 | Takahashi | |
| 7,849,450 B1* | 12/2010 | Rydh et al. | 717/131 |
| 7,926,024 B2* | 4/2011 | Clarke | 717/104 |
| 7,950,021 B2 | 5/2011 | Ting et al. | |
| 8,069,021 B2 | 11/2011 | Sturrock et al. | |
| 8,191,045 B2 | 5/2012 | Sankaranarayanan et al. | |
| 8,539,455 B2* | 9/2013 | Berg et al. | 717/131 |
| 2002/0129329 A1* | 9/2002 | Nishioka et al. | 717/104 |
| 2003/0046668 A1* | 3/2003 | Bowen | 717/131 |
| 2004/0153983 A1* | 8/2004 | McMillan | 716/5 |
| 2005/0108689 A1* | 5/2005 | Hooper et al. | 717/135 |
| 2005/0216891 A1 | 9/2005 | Sundararajan et al. | |
| 2008/0082095 A1* | 4/2008 | Shores et al. | 606/34 |
| 2008/0178159 A1* | 7/2008 | Roesner et al. | 717/128 |
| 2010/0115494 A1* | 5/2010 | Gorton, Jr. | 717/128 |
| 2010/0180263 A1* | 7/2010 | Lee et al. | 717/135 |
| 2010/0299651 A1* | 11/2010 | Fainekos et al. | 717/104 |
| 2012/0023553 A1 | 1/2012 | Berg et al. | |
| 2013/0019216 A1* | 1/2013 | Vasudevan et al. | 716/106 |
| 2013/0019224 A1* | 1/2013 | Madl et al. | 717/104 |

OTHER PUBLICATIONS

Borys J. Bradel, A study of potential parallelism among traces in Java programs, 2009, pp. 296-308.*

Vasile Mazilescu, The Relationship between Fuzzy Reasoining and its Temporal Characteristics for Knowledge Management Systems, 2010, pp. 1-7.*

Qi Liu, Hardware—in-the-loop simulation for automated benchmarking of cloud infrastructures, 2012, pp. 2540-2549.*

* cited by examiner

SYSTEMS AND METHODS FOR MINING TEMPORAL REQUIREMENTS FROM BLOCK DIAGRAM MODELS OF CONTROL SYSTEMS

TECHNICAL FIELD

Embodiments described herein generally relate to mining temporal requirements from block diagram models and, more specifically, to systems and methods that utilize natural language requirements to test block diagram based automobile computer programs.

BACKGROUND

Industrial-scale automotive control systems are developed using model-based design (MBD). In model-based design, the designer first captures the dynamical characteristics of the plant, such as the physical parts of the system using differential, logical, and algebraic equations. This is collectively called the plant model, and examples include: model of the turbo rotational dynamics, the thermodynamic model of subsystems within the engine, and atmospheric turbulence models. Based on certain high-level and often vaguely defined requirements, the designer then writes an executable specification model of the controller using block diagrams. Examples of informal requirements include, "better fuel-efficiency," "better performance," "lower emissions," and "resistance to turbulence." This step is followed by system testing, normally done as extensive simulations of the closed-loop system, which includes the plant and the controller with the goal of determining the time (or frequency) domain responses of the closed-loop system to complex sets of time-varying inputs. The process of validation then ideally requires the designer to determine if the time (or frequency) domain responses of the closed-loop system are consistent with the design goals or requirements. Otherwise, the model is corrected so that it meets its requirements In the MBD process, requirements are often either informally expressed in natural language or at times even left unspecified. It is usually assumed that the control designer has sufficient domain expertise to determine the quality of the design by simply looking at the simulation results. As a consequence, most formal validation approaches reduce to just checking code coverage against established coverage metrics for the controller code, while largely ignoring the closed-loop characteristics of the system.

SUMMARY

Systems and methods for mining a temporal requirement from a block diagram model of a closed loop control system are disclosed. One embodiment of a method includes simulating the closed loop control system of a vehicle to obtain simulation traces and determining a candidate requirement by instantiating a template requirement with values of the simulation traces to locate parameter values that suggest that the template requirement is fulfilled. Some embodiments of the method include determining whether a counterexample to the candidate requirement exists; and in response to determining that the counterexample to the candidate requirement exists, obtaining the counterexample to the candidate requirement and adding the counterexample to the simulation traces for inspection.

In another embodiment, a system for mining a temporal requirement from a block diagram model of a closed loop control system includes a parameter synthesis tool for receiving random simulation traces and a template requirement, the parameter synthesis tool creating a candidate requirement by instantiating the template requirement with values of the random simulation traces to locate parameter values that suggests that the temporal requirement is obtained. Also included is a falsification tool for receiving the candidate requirement and the and the block diagram model and determining whether a counterexample to the candidate requirement exists and, in response to determining that a counterexample of the candidate requirement exists, adding the counterexample to the random simulation traces for inspection.

In yet another embodiment, a computing device includes a memory that stores logic that, when executed by the computing device, causes the computing device to determine a template requirement from a natural language expression received from a designer. The template requirement may include an undefined value. Additionally, the logic may cause the computing device to simulate the closed loop control system of an automobile to obtain simulation traces, and may create a candidate requirement by instantiating the template requirement with values of the simulation traces to locate parameter values that suggests that the temporal requirement is obtained. In some embodiments, the logic causes the computing device to determine whether a counterexample to the candidate requirement exists. In response to determining that the counterexample to the candidate requirement exists, the logic may cause the computing device to obtain the counterexample to the candidate requirement and add the counterexample to the simulation traces for inspection. In response to determining that a counterexample to the candidate requirement does not exist, the computing device determines an inferred requirement.

These and additional features provided by the embodiments of the present disclosure will be more fully understood in view of the following detailed description, in conjunction with the drawings.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which.

DETAILED DESCRIPTION

Embodiments disclosed herein include systems and methods for algorithmically mining temporal requirements from a block-diagram-based specification of a closed-loop control system model. The mined requirements may be expressed in signal temporal logic (STL), which is closely related to metric temporal logic (MTL) and their satisfaction is measured using robust semantics. Specifically, embodiments disclosed herein are focused on reverse-engineering specifications (also referred to herein as "requirements") such as describing application program interface (API) usage rules. While many current approaches for mining requirements focus on static specification mining, these techniques are generally directed to mining the requirements without executing the software program. Conversely, embodiments disclosed herein are directed to mining specifications from executing the program.

Figure 1:
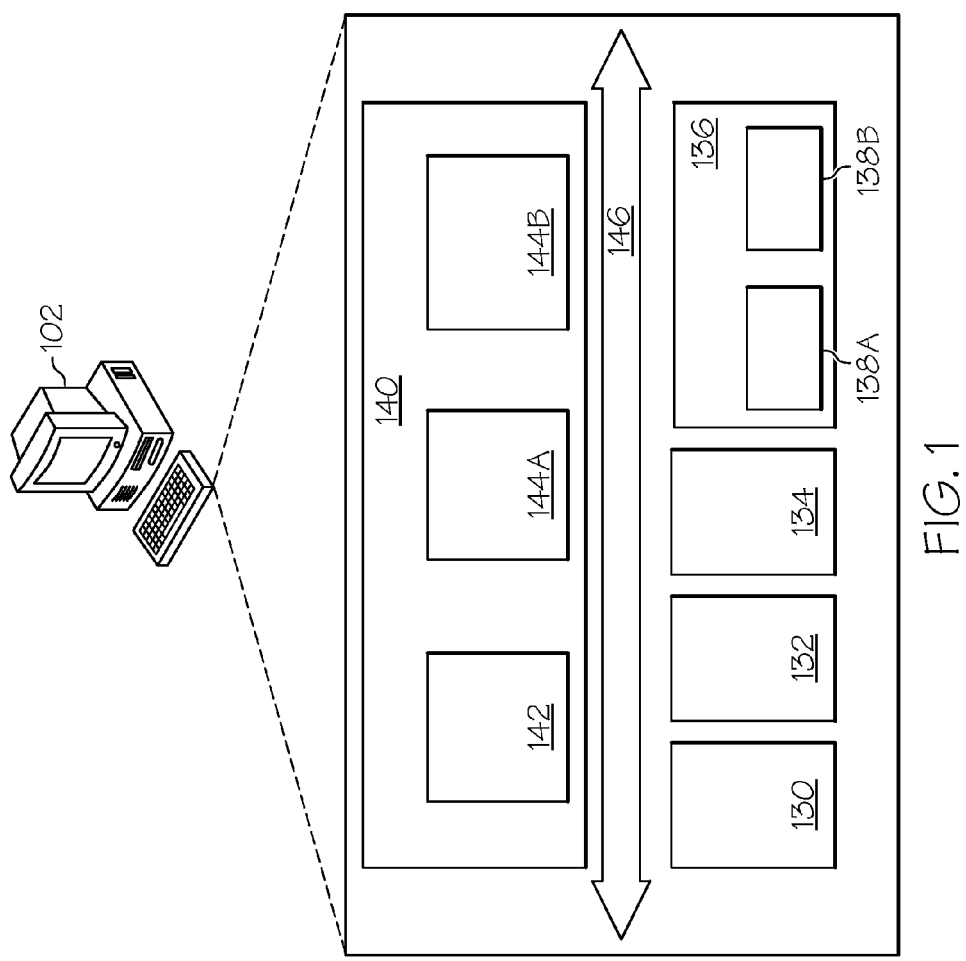
FIG. 1 depicts a computing device for mining a temporal requirement from a block diagram model of a closed loop control system, according to embodiments disclosed herein.

Referring now to the drawings, FIG. 1 depicts a computing device for mining a temporal requirement from a block diagram model of a closed loop control system, according to embodiments disclosed herein. In the illustrated embodiment, the user computing device 102 includes a processor 130, input/output hardware 132, network interface hardware 134, a data storage component 136 (which stores template data 138a and program data 138b), and the memory component 140. The memory component 140 may be configured as volatile and/or nonvolatile memory and, as such, may include random access memory (including SRAM, DRAM, and/or other types of RAM), flash memory, registers, compact discs (CD), digital versatile discs (DVD), and/or other types of non-transitory computer-readable mediums. Depending on the particular embodiment, the non-transitory computer-readable medium may reside within the user computing device 102 and/or external to the user computing device 102.

Additionally, the memory component 140 may be configured to store operating logic 142, the template logic 144a, and the mining tool 144b, each of which may be embodied as a computer program, firmware, and/or hardware, as an example. A local communications interface 146 is also included in FIG. 1 and may be implemented as a bus or other interface to facilitate communication among the components of the user computing device 102.

The processor 130 may include any processing component operable to receive and execute instructions (such as from the data storage component 136 and/or memory component 140). The input/output hardware 132 may include and/or be configured to interface with a monitor, keyboard, mouse, printer, camera, microphone, speaker, and/or other device for receiving, sending, and/or presenting data. The network interface hardware 134 may include and/or be configured for communicating with any wired or wireless networking hardware, a satellite, an antenna, a modem, LAN port, wireless fidelity (Wi-Fi) card, WiMax card, mobile communications hardware, and/or other hardware for communicating with other networks and/or devices. From this connection, communication may be facilitated between the user computing device 102 and other computing devices, such as a vehicle computing device.

Similarly, it should be understood that the data storage component 136 may reside local to and/or remote from the user computing device 102 and may be configured to store one or more pieces of data for access by the user computing device 102 and/or other components. In some embodiments, the data storage component 136 may be located remotely from the user computing device 102 and thus accessible via the network. In some embodiments however, the data storage component 136 may merely be a peripheral device, but external to the user computing device 102.

Included in the memory component 140 are the operating logic 142, the template logic 144A and the mining tool 144B. The operating logic 142 may include an operating system and/or other software for managing components of the user computing device 102. Similarly, the template logic 144A may be configured to cause the user computing device 102 to utilize the template data 138a for creating a template requirement from natural language. The mining tool 144B may cause the user computing device 102 to implement the block diagram model for determining the inferred requirements.

It should be understood that the components illustrated in FIG. 1 are merely exemplary and are not intended to limit the scope of this disclosure. While the components in FIG. 1 are illustrated as residing within the user computing device 102, this is merely an example. In some embodiments, one or more of the components may reside external to the user computing device 102.

Figure 2:
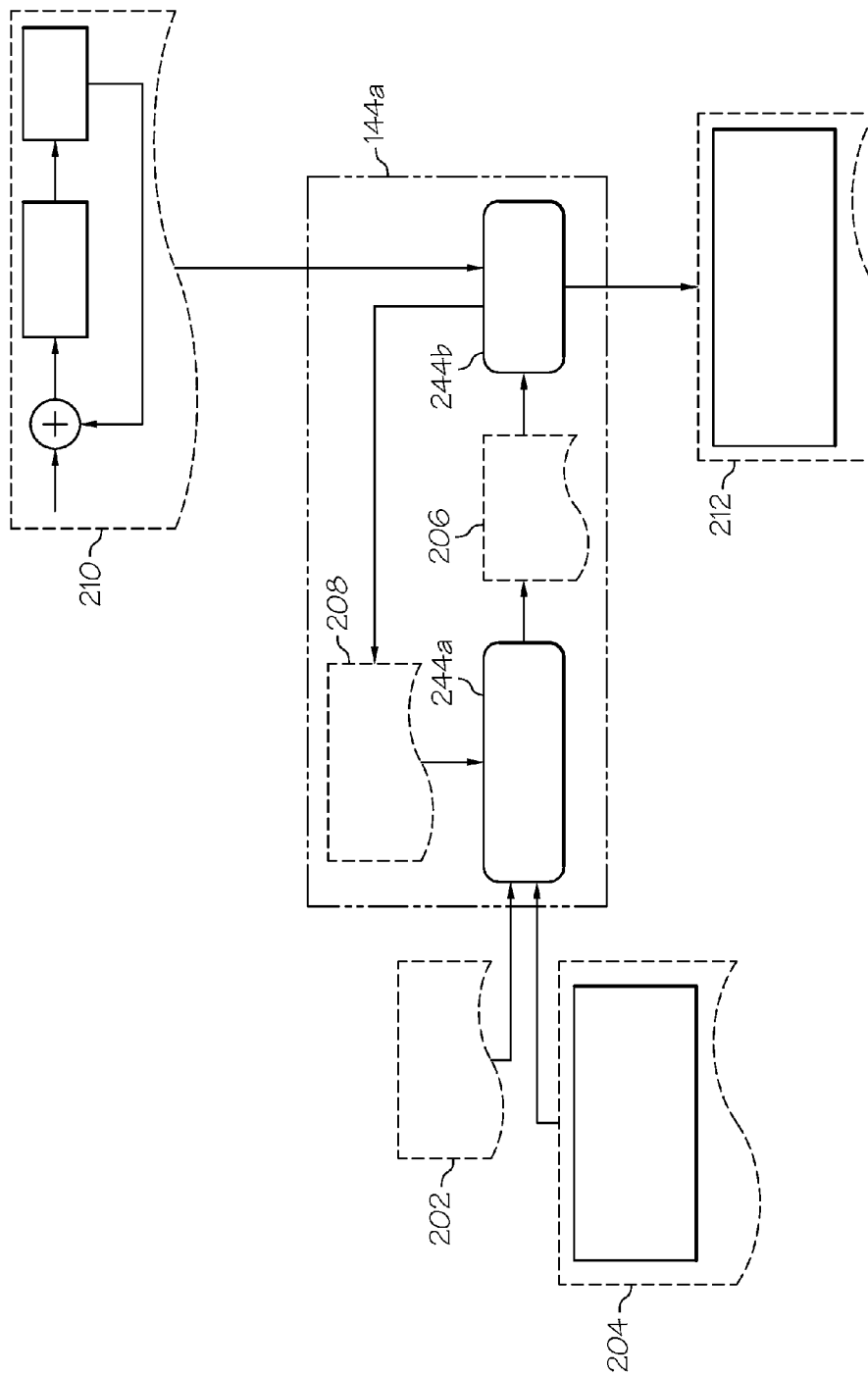
FIG. 2 depicts a functional block diagram illustrating operation of the mining tool, according to embodiments disclosed herein.

FIG. 2 depicts a functional block diagram illustrating operation of the mining tool, according to embodiments disclosed herein. Included is the mining tool 144B, which includes a parameter synthesis tool 244a and a falsification tool 244b. Specifically, embodiments disclosed herein are configured such that the inputs to the mining tool 144B are the control block diagram model 210, random simulation traces 202 that are derived from simulating the control block diagram model 210, and a template requirement 204, which is a parametric-STL property in which certain values are left unspecified.

Specifically, when a designer is testing the control block diagram model 210 the user computing device 102 may provide the designer with a user interface (or more than one user interface) for inputting a natural language expression of a temporal property. The user interfaces may include a templated form for the designer to input the characteristics. As will be understood, the templated requirement may include an undefined value (one or more). As an example, the designer may input that eventually between time 0 and time $t_1$, the signal x is less than $v_1$, and from that point for $t_2$ seconds, it remains less than $v_2$. As the designer will not likely know values for the values for $t_1$, $t_2$, $v_1$, and $v_2$ (also referred to as parameters), these values will be determined by the mining tool 144B.

Once the designer has inputted the natural language expression, the user computing device 102 may determine a parametric-STL expression for the natural language expression. The above property would be expressed as: $\Diamond_{[0,t_1]} (x<v_1 \wedge \Box_{[0,t_2]} (x<v_2))$, which will be sent as the template requirement 204 to the parameter synthesis tool 244a.

As illustrated, the mining tool 144B may receive the random simulation traces 202, as well as the template requirement 204. The random simulation traces 202 may be obtained by simulating the closed loop system and determining values that result. With the template requirement 204 and the random simulation traces 202, the parameter synthesis tool 244a can search the parameter space to find one or more optimal parameter values that suggests that the temporal requirement is obtained by instantiating the template requirement 204 with the values satisfied by all of the random simulation traces 202. With this information, the parameter synthesis tool 244a can create a candidate requirement 206, which is the instantiated template requirement.

Specifically, the parameter synthesis tool 244a may receive the random simulation traces 202 and the template requirement 204 and determines the values that will cause the template requirement to be true. Referring to the example above, the parameters $t_1$, $t_2$, $v_1$, and $v_2$ were unspecified by the designer. Thus, the parameter synthesis tool 244a utilizes the random simulation traces 202 (which represent values resulting from a simulation of the control block diagram model 210) to determine values for $t_1$, $t_2$, $v_1$, and $v_2$ that potentially make the template requirement 204 valid. These values are referred to as the candidate requirement 206.

It should be understood that the parameter synthesis tool 244a may also be configured to improve efficiency by utilizing monotonicity for the satisfaction of the parametric-STL formula. Specifically, when the template requirement 204 and random simulation traces 202 are utilized to determine candidate requirements, the parameter synthesis tool 244*a* may utilize a process for neglecting certain aspects of the random simulation traces 202. Specifically, if a certain result is inevitable for a particular line or the random simulation traces, the parameter synthesis tool 244*a* may improve efficiency by neglecting those portions where the result is inevitable.

The candidate requirement 206 is then utilized by the falsification tool 244*b*, which also receives the control block diagram model 210 to determine whether any counterexamples to the candidate requirement 206 exist. Specifically, the falsification tool 244*b* utilizes the candidate requirement 206 in the control block diagram model 210 to determine if there are any scenarios where the candidate requirements do not yield a valid result (e.g., that the template requirement 204 is not true). If the falsification tool 244*b* determines a counterexample, the corresponding counterexample traces 208 are sent as a feedback to the parameter synthesis tool 244*a*. The parameter synthesis tool then utilizes the counterexample traces 208 with the random simulation traces 208 to find a candidate requirement that fulfills the template requirement 204, with the counterexample being considered. If the falsification tool 244*b* determines that no counterexamples exist (or that no additional counterexamples exist), an inferred requirement 212 is generated and sent to output. The inferred requirement 212 represents the values of the parameters that fulfill the template requirement 204.

As illustrated, the control block diagram model 210 represents a hybrid system that may be utilized for describing the evolving behavior of a mixture of continuous-valued and discrete-valued program variables. In general, the control block diagram model 210 can be used to represent differential, algebraic, and/or logical equations that describe the closed loop system. The semantics of the control block diagram model 210 are vastly different from the semantics of a software program. As an example, a module in such a model may continuously process inputs, producing outputs. Thus, the kinds of requirements expected of such a model are incompatible with most traditional software targeted by existing specification mining tools.

Figure 3:
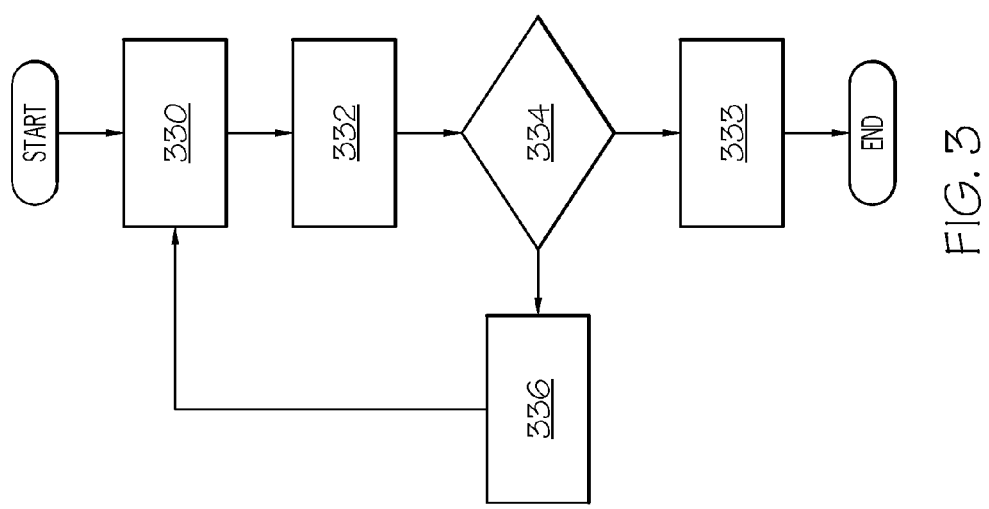
FIG. 3 depicts a flowchart for mining a temporal requirement from a block diagram model of a closed loop control system, according to embodiments disclosed herein.

FIG. 3 depicts a flowchart for mining a temporal requirement from a block diagram model of a closed loop control system, according to embodiments disclosed herein. As illustrated in block 330, the closed-loop system is simulated to obtain a set of simulation traces. In block 332, a candidate requirement may be created by instantiating a template requirement with values of the simulation traces to locate parameter values that suggests that the temporal requirement is obtained. The temporal requirement may include a parametric-signal-temporal-logic property. In block 334, a determination may be made regarding whether a counterexample to the candidate requirement exists. If so, in block 336, the counterexample to the candidate requirement may be obtained and added to the simulation traces for inspection. From block 336, the process may return to block 330. If in block 334, there are no existing counterexamples, in block 336, the process may be terminated with an inferred requirement.

As described above, embodiments disclosed herein include a counterexample-guided process to mine STL requirements for control block-diagram models. This process is applied on models of unprecedented complexity, such as an actual design of a large control subsystem for a diesel engine. Accordingly, embodiments disclosed herein introduce the notion of monotonicity of the satisfaction of a Parametric-STL formula as an extension of the notion of polarity. This procedure may be based on binary search for synthesizing parameters for Parametric-STL properties that respect the monotonicity assumption.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

It should now be understood that embodiments disclosed herein includes systems, methods, and non-transitory computer-readable mediums for mining a temporal requirement. As discussed above, such embodiments are configured to determine a template requirement, as well as values for including in the template requirement. It should also be understood that these embodiments are merely exemplary and are not intended to limit the scope of this disclosure.

What is claimed is:

1. A method for mining a temporal requirement from a block diagram model of a closed loop control system, comprising:
   simulating the closed loop control system of a vehicle to obtain simulation traces;
   determining a candidate requirement by instantiating a template requirement with values of the simulation traces to locate parameter values that suggest that the template requirement is fulfilled, wherein the template requirement includes an undefined value;
   determining whether a counterexample to the candidate requirement exists;
   in response to determining that the counterexample to the candidate requirement exists, obtaining the counterexample to the candidate requirement and adding the counterexample to the simulation traces for inspection; and
   in response to determining that a counterexample to the candidate requirement does not exist, outputting an inferred requirement, wherein the inferred requirement defines the undefined value, wherein the block diagram model is utilized to determine whether a counterexample to the candidate requirement exists and wherein the block diagram model describes evolving behavior of continuous-valued and discrete valued program variables of a computer program of the vehicle.

2. The method of claim 1, wherein the method repeats until no more counterexamples are found to exist.

3. The method of claim 1, wherein the block diagram model represents at least one of the following: differential equations, algebraic equations, and logical equations.

4. The method of claim 1, wherein the template requirement is represented in Parametric-signal-temporal-logic.

5. The method of claim 1, further comprising:
   providing a user interface for a designer to provide a natural language expression; and
   creating the template requirement from the natural language expression.

6. A system for mining a temporal requirement from a block diagram model of a closed loop control system, comprising a memory component that stores at least the following:
   a parameter synthesis tool for simulating a closed loop control system of an automobile for receiving random simulation traces and a template requirement, the parameter synthesis tool creating a candidate requirement by instantiating the template requirement with values of the random simulation traces to locate parameter values that suggests that the temporal requirement is obtained, wherein the template requirement includes a property in which at least one value is left unspecified; and a falsification tool for receiving the candidate requirement and the block diagram model and model, determining whether a counterexample to the candidate requirement exists and, exists, in response to determining that a counterexample of the candidate requirement exists, obtaining the counterexample to the candidate requirement from the parameter synthesis tool and adding the counterexample to the random simulation traces for inspection, and in response to determining that a counterexample to the candidate requirement does not exist, outputting an inferred requirement.

7. The system of claim 6, wherein the block diagram model is utilized to determine whether a counterexample to the candidate requirement exists and wherein the block diagram model describes evolving behavior of continuous-valued and discrete valued program variables of a computer program of the closed loop control system.

8. The system of claim 6, wherein the block diagram model represents at least one of the following: differential equations, algebraic equations, and logical equations.

9. The system of claim 5, wherein the system further performs at least the following:
provide a user interface for a designer to provide a natural language expression; and
create the template requirement from the natural language expression.

10. The system of claim 6, wherein the temporal requirement comprises a parametric-signal-temporal-logic property in which a value is left unspecified.

11. A computing device for mining a temporal requirement from a block diagram model of a closed loop control system, comprising a memory that stores logic that, when executed by the computing device, causes the computing device to perform at least the following:
determine a template requirement from a natural language expression received from a designer, the template requirement including an undefined value;
simulate the closed loop control system of an automobile to obtain simulation traces;
create a candidate requirement by instantiating the template requirement with values of the simulation traces to locate parameter values that suggests that the temporal requirement is obtained;
determine whether a counterexample to the candidate requirement exists;
in response to determining that the counterexample to the candidate requirement exists, obtain the counterexample to the candidate requirement and add the counterexample to the simulation traces for inspection; and
in response to determining that a counterexample to the candidate requirement does not exist, the computing device determines an inferred requirement.

12. The computing device of claim 1, wherein the method repeats until no additional counterexamples are found to exist.

13. The computing device of claim 12, wherein the block diagram model is utilized to determine whether a counterexample to the candidate requirement exists and wherein the block diagram model describes evolving behavior of continuous-valued and discrete valued program variables of a computer program of the closed loop control system.

14. The computing device of claim 11, wherein the block diagram model represents at least one of the following: differential equations, algebraic equations, and logical equations.

15. The computing device of claim 11, wherein the logic further causes the computing device to perform at least the following:
provide a user interface for the designer to provide the natural language expression; and
create the template requirement from the natural language expression.

16. The computing device of claim 11, wherein the template requirement comprises a parametric-signal-temporal-logic property in which a value is left unspecified.

* * * * *

UNITED STATES PATENT AND TRADEMARK OFFICE
CERTIFICATE OF CORRECTION

PATENT NO. : 9,081,900 B2  
APPLICATION NO. : 13/651961  
DATED : July 14, 2015  
INVENTOR(S) : Deshmukh et al.

Page 1 of 1

It is certified that error appears in the above-identified patent and that said Letters Patent is hereby corrected as shown below:

Claims

Col. 7, Claim 6, Line 7  
"and the block diagram model and model, determining" should read  
-- and the block diagram model, determining --

Col. 7, Claim 6, Line 9  
"exists and, exists, in response to determining that a coun-" should read  
-- exists, in response to determining that a coun- --

Col. 7, Claim 9, Line 26  
"The system of claim 5, wherein the system further per-" should read  
-- The system of claim 6, wherein the system further per- --

Col. 8, Claim 12, Line 58  
"The computing device of claim 1, wherein the method" should read  
-- The computing device of claim 11, wherein the method --

Signed and Sealed this  
Fifth Day of January, 2016

Michelle K. Lee  
*Director of the United States Patent and Trademark Office*